US012707978B2

(12) United States Patent
Chan et al.

(10) Patent No.: US 12,707,978 B2
(45) Date of Patent: Aug. 11, 2026

(54) MEMORY DEVICE AND FABRICATING METHOD THEREOF

(71) Applicant: NANYA TECHNOLOGY CORPORATION, New Taipei City (TW)

(72) Inventors: Hui Tzu Chan, New Taipei City (TW); Ying-Cheng Chuang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 646 days.

(21) Appl. No.: 18/178,525

(22) Filed: Mar. 5, 2023

(65) Prior Publication Data

US 2024/0297125 A1 Sep. 5, 2024

(51) Int. Cl.
*H10W 42/00* (2026.01)
*H10B 12/00* (2023.01)

(52) U.S. Cl.
CPC .......... *H10W 42/121* (2026.01); *H10B 12/09* (2023.02); *H10B 12/50* (2023.02)

(58) Field of Classification Search
CPC ........ H10B 12/09; H10B 12/50; H01L 23/562
See application file for complete search history.

(56) References Cited

U.S. PATENT DOCUMENTS

2016/0204142 A1* 7/2016 Um .................... H10F 39/807 257/446
2020/0020567 A1* 1/2020 Sun .................... H10W 10/20
2020/0251571 A1* 8/2020 Tsai .................... H10D 64/021

FOREIGN PATENT DOCUMENTS

KR 100972899 B1 * 7/2010 ............ H10P 50/695

* cited by examiner

*Primary Examiner* — Edward Chin
(74) *Attorney, Agent, or Firm* — CKC & Partners Co., LLC

(57) ABSTRACT

A memory device includes a substrate, an oxide layer, and a plurality of spacers. The substrate includes a silicon layer, a nitride layer, and a plurality of isolation trenches. The nitride layer overlies the silicon layer. The plurality of isolation trenches penetrates through the nitride layer and a portion of the silicon layer. The oxide layer fills the plurality of isolation trenches and has a surface that is coplanar with a surface of the nitride layer. The plurality of spacers is encircled in the oxide layer, in which top surfaces of the plurality of spacers are covered by the oxide layer.

9 Claims, 13 Drawing Sheets

MEMORY DEVICE AND FABRICATING METHOD THEREOF

BACKGROUND

Technical Field

The present disclosure relates to a memory device and a fabricating method thereof. More particularly, the present disclosure relates to a memory device and a fabricating method of spacers for relieving stress in a memory device.

Description of Related Art

As the integration density of memory devices increases, distances between features have gradually decreased. In turn, in memory integrated circuit (memory IC) fabrication, the critical dimension of an active area has become smaller. Thus, it requires a specific deposition process to fill the shallow trench isolation (STI) in the active area, especially for one that has densely patterned and sparsely patterned zones. However, certain deposition processes may cause stress concentration around the interface of different deposited layers. The stress induces warpage of the structure and therefore pattern scattering.

Accordingly, how to provide a memory device and a fabricating method for relieving stress in a memory device to solve the aforementioned problems becomes an important issue to be solved by those in the industry.

SUMMARY

An aspect of the disclosure is to provide a memory device and a fabricating method of a memory device that may efficiently solve the aforementioned problems.

According to an embodiment of the disclosure, a memory device includes a substrate, an oxide layer, and a plurality of spacers. The substrate includes a silicon layer, a nitride layer, and a plurality of isolation trenches. The nitride layer overlies the silicon layer. The isolation trenches penetrate through the nitride layer and a portion of the silicon layer. The oxide layer fills the isolation trenches and has a surface that is coplanar with a surface of the nitride layer. The spacers are encircled in the oxide layer, in which top surfaces of the spacers are covered by the oxide layer.

In an embodiment of the disclosure, the isolation trenches form a first patterned zone and a second patterned zone. The first patterned zone includes a plurality of first trenches having first trench widths. The second patterned zone includes a plurality of second trenches having second trench widths. The first trench widths are larger than the second trench widths.

In an embodiment of the disclosure, the spacers are disposed in the first trenches.

In an embodiment of the disclosure, the nitride layer includes silicon nitride.

In an embodiment of the disclosure, the oxide layer includes silicon oxide.

According to another embodiment of the disclosure, a fabricating method of a memory device includes forming a plurality of isolation trenches in a substrate, in which the substrate includes a silicon layer and a first nitride layer; forming a first oxide layer carpet-covering the first nitride layer and the isolation trenches; forming a second nitride layer carpet-covering the first oxide layer; removing portions of the second nitride layer so that at least a portion of the first oxide layer is exposed and remaining portions of the second nitride layer form a plurality of spacers with their top surfaces lower than a surface of the substrate; and forming a second oxide layer to cover the spacers to an extent that the surface of the second oxide layer is higher than the surface of the substrate.

In an embodiment of the disclosure, the fabricating method of a memory device further includes removing portions of the second oxide layer such that the second oxide layer and the substrate are coplanar.

In an embodiment of the disclosure, the removing the portions of the second oxide layer is performed by chemical mechanical polishing.

In an embodiment of the disclosure, the forming the isolation trenches includes forming the first nitride layer overlying the silicon layer; forming a photoresist layer overlying the first nitride layer; performing a lithography process to remove portions of the photoresist layer; etching through the first nitride layer and a portion of the silicon layer utilizing remaining portions of the photoresist layer as an etching mask to form the isolation trenches; and removing the remaining portions of the photoresist layer.

In an embodiment of the disclosure, the etching through the first nitride layer and the portion of the silicon layer is performed by reactive ion etching.

In an embodiment of the disclosure, the isolation trenches are formed such that the isolation trenches form a first patterned zone and a second patterned zone upon completion of etching, the first patterned zone includes a plurality of first trenches having first trench widths, the second patterned zone includes a plurality of second trenches having second trench widths, and the first trench widths are larger than the second trench widths.

In an embodiment of the disclosure, the forming the second oxide layer includes depositing the second oxide layer by spin on dielectric deposition process; and densifying the second oxide layer.

In an embodiment of the disclosure, the first nitride layer and the second nitride layer include silicon nitride, and the first oxide layer and the second oxide layer include silicon oxide.

In an embodiment of the disclosure, the removing the portions of the second nitride layer is performed by an etching process that has a high selectivity between silicon nitride and silicon oxide so that the first oxide layer remains substantially identical when the portions of the second nitride layer are etched away.

In an embodiment of the disclosure, the forming the second nitride layer is performed by chemical vapor deposition.

Accordingly, in the memory device and the fabricating method of the present disclosure, by disposing spacers in the shallow trench isolations around the peripheral circuit area, stress concentration on the interfaces between layers may be reduced. To be more specific, less stress concentration may prevent warpage and pattern scattering, and thus reduces misalignment and consequent bit line overlay shift. Hence, a highly miniaturized memory device with less bit line-to-bit line current leakage issues may be accomplished.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
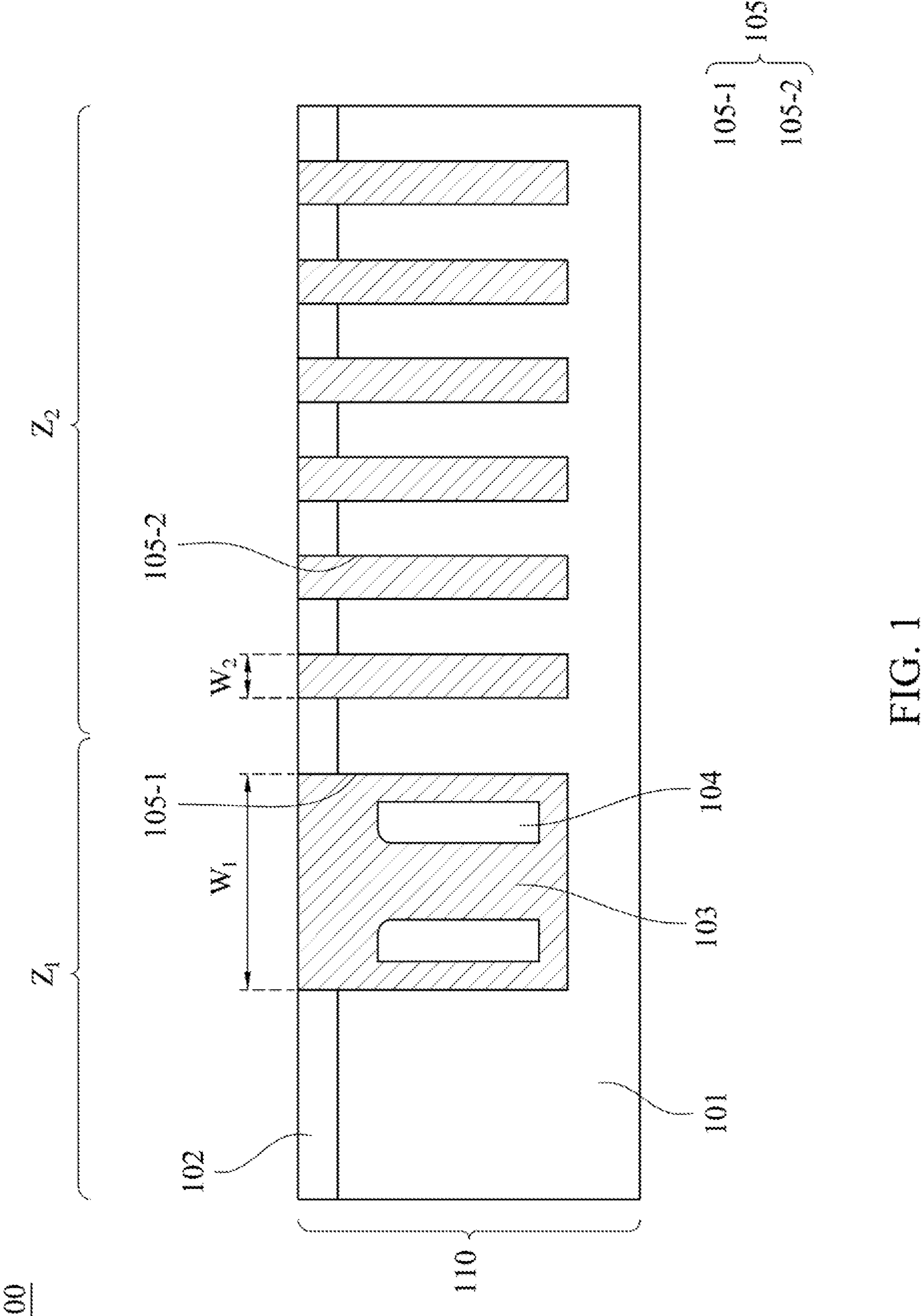
FIG. 1 is a partial cross-sectional view of an intermediate structure of a memory device according to an embodiment of the disclosure.

Reference will now be made in detail to the present embodiments of the disclosure, examples of which are illustrated in the accompanying drawings. Wherever possible, the same reference numbers are used in the drawings and the description to refer to the same or like parts. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

As the integration density of memory devices increases, the dimensions of memory devices have scaled down. In turn, in memory integrated circuit (memory IC) fabrication, the critical dimension of an active area has become smaller. Thus, it requires a specific deposition process to fill the shallow trench isolation (STI) in the active area, especially for one that has densely patterned and sparsely patterned zones. However, certain deposition processes may cause stress concentration around the interfaces of different deposited layers, especially those regarding silicon layers. The stress induces warpage of the structure and therefore pattern scattering. According to some embodiment of this disclosure, spacers are disposed in the shallow trench isolation to protect the bulk silicon during subsequent steps.

Reference is made to FIG. 1. FIG. 1 illustrates a partial cross-sectional view of an intermediate structure of memory device 100 according to an embodiment of the present disclosure. As shown in FIG. 1, the memory device 100 includes a substrate 110, an oxide layer 103, and a plurality of spacers 104.

The substrate 110 includes a silicon layer 101, a nitride layer 102, and a plurality of isolation trenches 105 penetrating through the nitride layer 102 and a portion of the silicon layer 101. The silicon layer 101 may include silicon, silicon-on-insulator (SOI), silicon-on-sapphire (SOS), doped and undoped semiconductors, epitaxial layers of silicon supported by a base semiconductor foundation, and other semiconductor structures. The nitride layer 102 includes a silicon nitride layer. Preferably, the nitride layer 102 has a thickness of about 20 nm to about 30 nm. The isolation trenches 105 may be formed by selectively removing portions of the nitride layer 102 and portions of silicon layer 101, which will be described in detail in the following paragraphs.

As shown in FIG. 1, the isolation trenches 105 form a first patterned zone $Z_1$ and a second patterned zone $Z_2$. The first patterned zone $Z_1$ is sparsely patterned while the second patterned zone $Z_2$ is densely patterned. For example, in an exemplary dynamic random access memory (DRAM) structure, the first patterned zone $Z_1$ corresponds to a peripheral circuit region, and the second patterned zone $Z_2$ corresponds to a memory cell array region. In the first patterned zone $Z_1$, there is a plurality of first isolation trenches 105-1 having first trench widths $W_1$. In the second patterned zone $Z_2$, there is a plurality of second isolation trenches 105-2 having second trench widths $W_2$. The first isolation trenches 105-1 and the second isolation trenches 105-2 are collectively referred to as isolation trenches 105. FIG. 1 shows one of the first isolation trenches 105-1 and several second isolation trenches 105-2. According to the characteristics of the peripheral circuit region and the memory cell array region, the first trench width $W_1$ is larger than the second trench width $W_2$.

The oxide layer 103 may be a silicon oxide ($SiO_2$) layer having a thickness of about 100 nm to about 150 nm. The oxide layer 103 fills the isolation trenches 105 and has a surface that is coplanar with the surface of the nitride layer 102. Specifically, the top surface of the oxide layer 103 and the top surface of the nitride layer 102 that are away from the silicon layer 101 are coplanar with each other.

The spacers 104 include silicon nitride (SiN, $Si_3N_4$), with a thickness of about 20 nm to about 30 nm. As shown in FIG. 1, the spacers 104 are disposed in the first isolation trench 105-1. The spacers 104 are fully encircled in the oxide layer 103. The top surfaces of the spacers 104 are lower than the top surface of the nitride layer 102. In some embodiments, the top surfaces of the spacers 104 are lower than the top surface of the silicon layer 101. More particularly, the top surfaces of the spacers 104 are covered by the oxide layer 103.

Moreover, the spacers 104 are separated from the substrate 110. That is to say, portions of the oxide layer 103 are disposed between the spacers 104 and the silicon layer 101 as well as between the spacers 104 and the nitride layer 102.

Similarly, the spacers 104 are separated from one other. Portions of the oxide layer 103 are disposed between the spacers 104.

Figure 2:
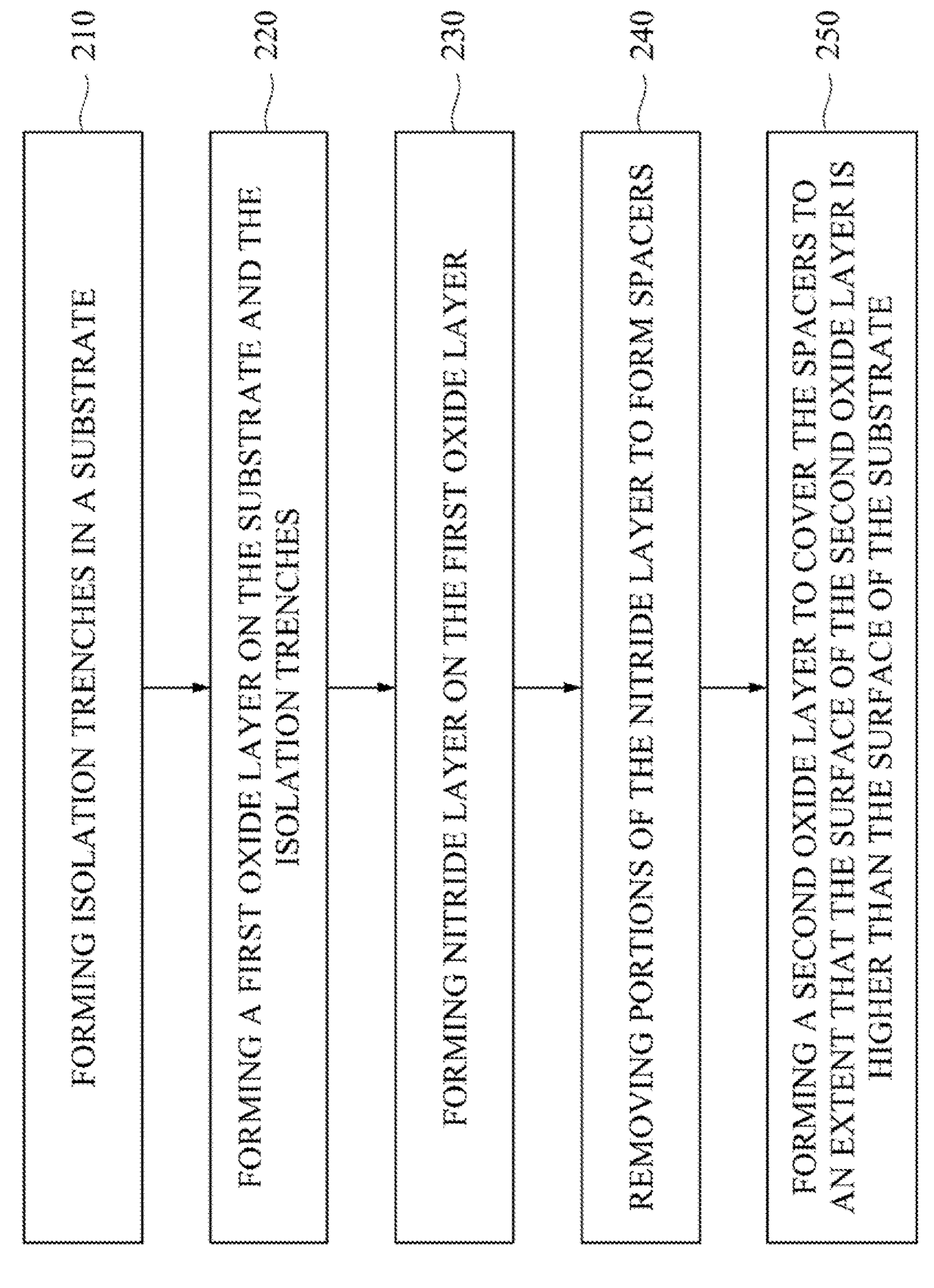
FIG. 2 is a flow chart of a fabricating method of a memory device according to an embodiment of the present disclosure.

Reference is made to FIG. 2. FIG. 2 is a flow chart of method 200 according to an embodiment of the present disclosure. As shown in FIG. 2, method 200 involves operation 210 of forming isolation trenches in a substrate. Method 200 also involves operation 220 of forming a first oxide layer on the substrate and the isolation trenches. Method 200 proceeds to operation 230 of forming a nitride layer on the first oxide layer. Then, method 200 continues to operation 240 of removing portions of the nitride layer to form spacers. Also, method 200 involves operation 250 of forming a second oxide layer to cover the spacers to an extent that the surface of the second oxide layer is higher than the surface of the substrate. In the following paragraphs, the operations of method 200 will be described in detail.

Figure 3A:
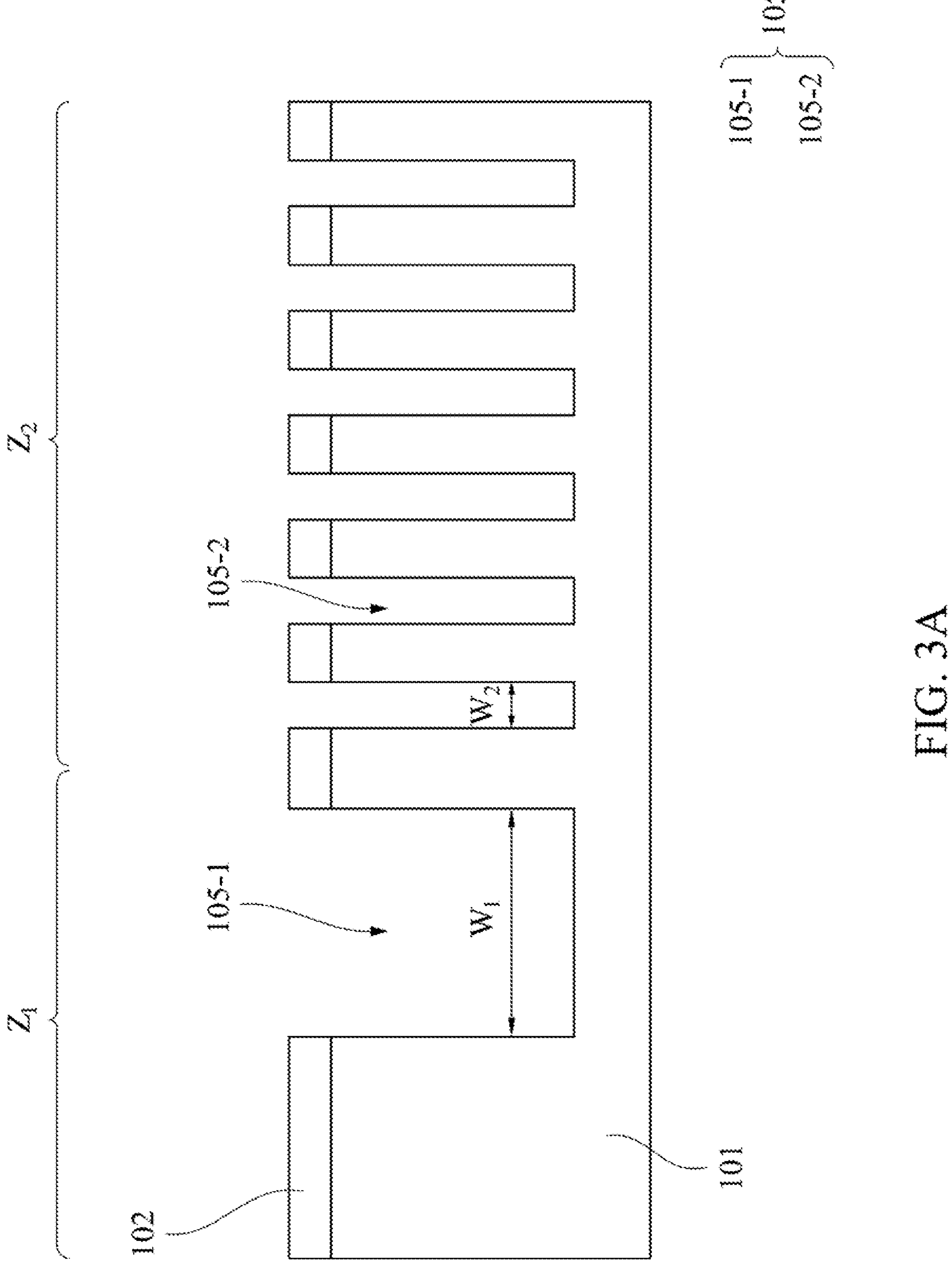
FIG. 3A is a partial cross-sectional view of an intermediate stage of a fabricating method of a memory device according to an embodiment of the disclosure.

Reference is made to FIG. 3A. FIG. 3A shows a partial cross-sectional view of an intermediate stage of method 200 in FIG. 2 according to an embodiment of the present disclosure. As shown in FIG. 3A, after operation 210, the nitride layer 102 overlies the silicon layer 101. The nitride layer 102 includes silicon nitride. The nitride layer 102 is formed to have a thickness of about 20 nm to about 30 nm. For example, the thickness of the nitride layer 102 is about 25 nm.

As shown in FIG. 3A, the isolation trenches 105 form a first patterned zone $Z_1$ and a second patterned zone $Z_2$. The first patterned zone $Z_1$ includes first isolation trenches 105-1 having first trench widths $W_1$ while the second patterned zone $Z_2$ includes second isolation trenches 105-2 having second trench widths $W_2$. The first isolation trenches 105-1 and the second isolation trenches 105-2 are collectively referred to as isolation trenches 105. FIG. 3A shows one of the first isolation trenches 105-1 and several second isolation trenches 105-2. As shown in FIG. 3A, the first trench width $W_1$ is larger than the second trench width $W_2$.

Figure 3B:
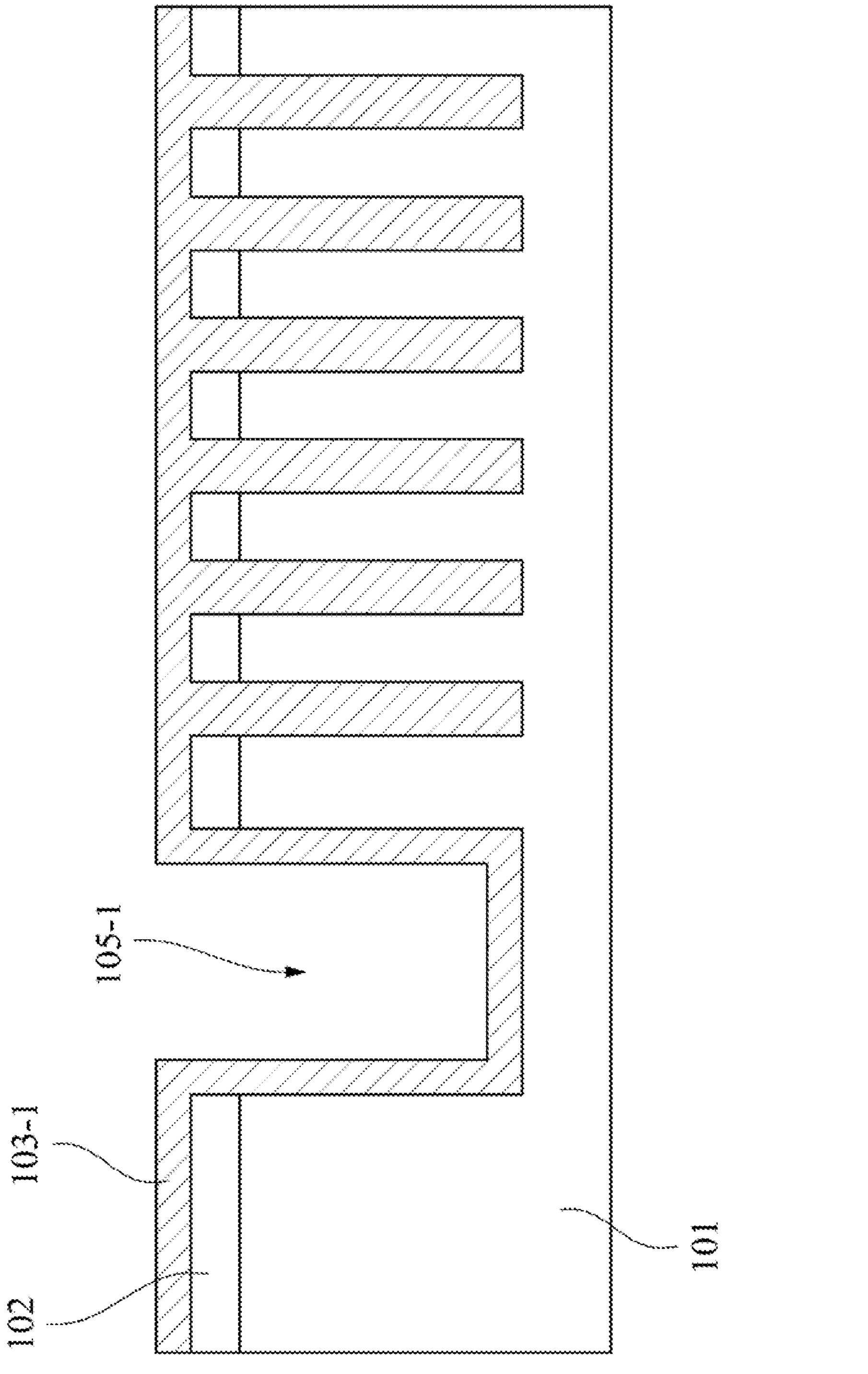
FIG. 3B is a partial cross-sectional view of an intermediate stage of a fabricating method of a memory device according to an embodiment of the disclosure.

Reference is made to FIG. 3B. FIG. 3B shows a partial cross-sectional view of an intermediate stage of method 200 in FIG. 2 according to an embodiment of the present disclosure. As shown in FIG. 3B, after operation 220, the first oxide layer 103-1 is deposited on the silicon layer 101, the nitride layer 102, and the isolation trenches 105. More particularly, the thickness of the first oxide layer 103-1 is deliberately chosen so that the second isolation trenches 105-2 (referring to FIG. 3A) are fully filled with the first oxide layer 103-1 while the first isolation trench 105-1 is partially filled with the first oxide layer 103-1 in operation 220.

In a highly miniaturized DRAM structure, after the deposition of the oxide layer 103, the interfaces between the oxide layer 103 and the silicon layer 101 are susceptible to stress concentration due to lattice difference between the layers. In this case, the stress concentration adds up and leads to warpage on the edges of layers of the structure. The warpage can bring about the pattern scattering of the active area of the highly miniaturized DRAM structure, which induces misalignment and consequent bit line overlay shift. This type of shift causes bit line contact structures to be short to capacitance contact structures. Later, in the wafer acceptance test (WAT) stage, the aforementioned phenomenon embodies in the form of bit line-to-bit line current leakage issues as well as the current leakage issues between bit lines and the portions of the silicon layer 101 that are adjacent to the bit lines.

For example, referring back to FIG. 1, when the oxide layer 103 is deposited within one operation by flowable chemical vapor deposition process (FCVD), compressive stress occurs on the edge of the oxide layer 103. This compressive stress, in turn, imposes a bending moment on the edge of the silicon layer 101 and thus distorting the edge pattern thereupon. Therefore, in some embodiments of this disclosure, a portion of the oxide layer 103, i.e., the first oxide layer 103-1 is deposited first with higher density around the silicon layer 101. In this way, the stress concentration on the interface is reduced and it is ensured that the bit line contact structures form right over the bit lines. After the first oxide layer 103-1 is deposited, the second isolation trenches 105-2 are fully filled and the first isolation trench 105-1 is partially filled.

In an exemplary embodiment, the first oxide layer 103-1 is deposited by high-density chemical vapor deposition process. In this process, the oxide is grown on an atomic scale. Therefore, the structure of the first oxide layer 103-1 is homogeneous and conformal with relatively higher density and lower stress concentration than an oxide layer deposited by FCVD.

Figure 3C:
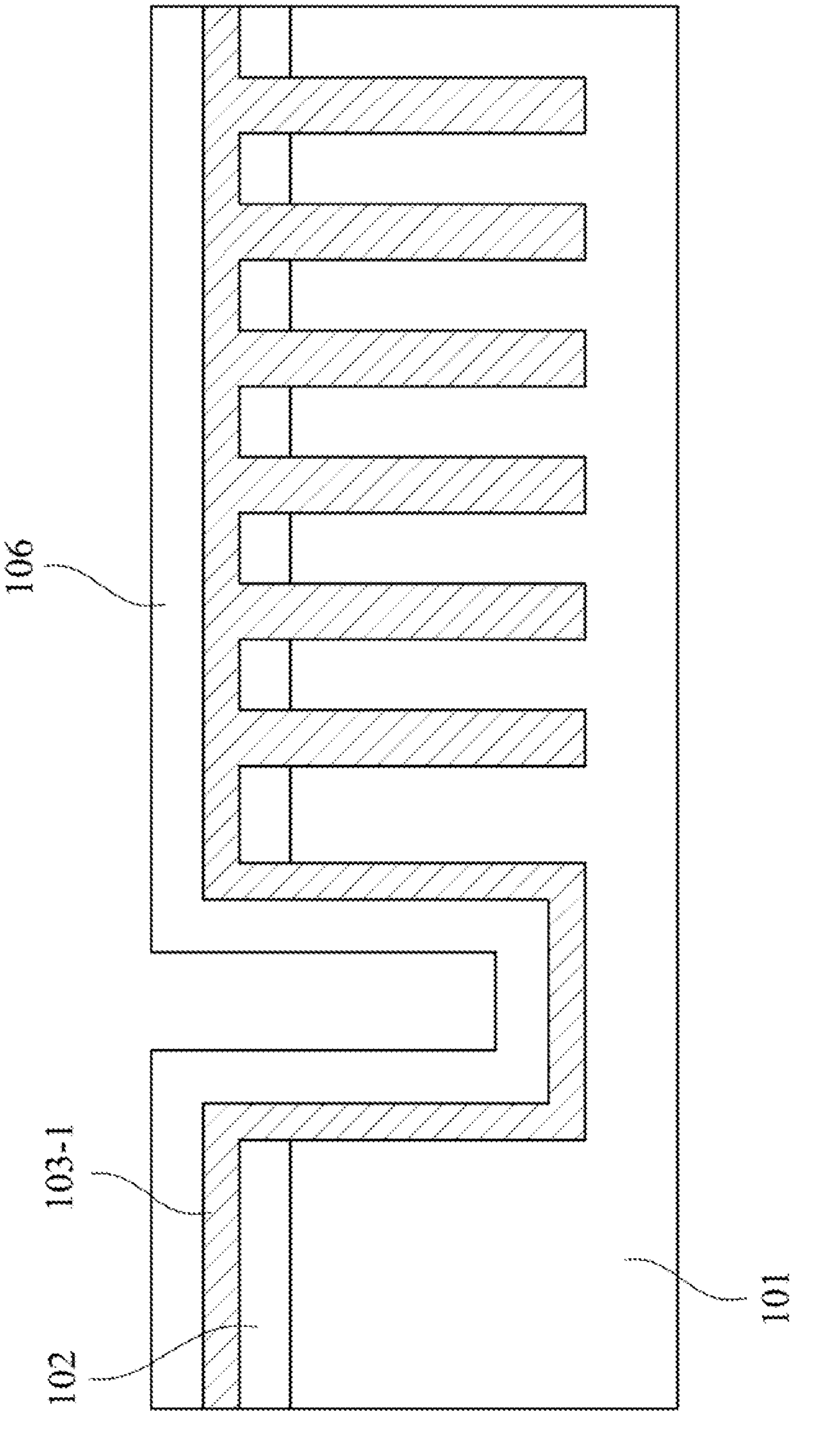
FIG. 3C is a partial cross-sectional view of an intermediate stage of a fabricating method of a memory device according to an embodiment of the disclosure.

Reference is made to FIG. 3C. FIG. 3C shows a partial cross-sectional view of an intermediate stage of method 200 in FIG. 2 according to an embodiment of the present disclosure. As shown in FIG. 3C, after operation 230, the nitride layer 106 is deposited on the first oxide layer 103-1 with a thickness of about 20 nm to about 30 nm. The nitride layer 106 may be deposited using any suitable type of chemical vapor deposition (CVD) processes, such as plasma-enhanced CVD (PECVD), low-pressure CVD (LPCVD), thermal CVD, hot filament CVD (HFCVD), or high-density plasma CVD (HDPCVD). The nitride layer 106 may include silicon nitride.

Figure 3D:
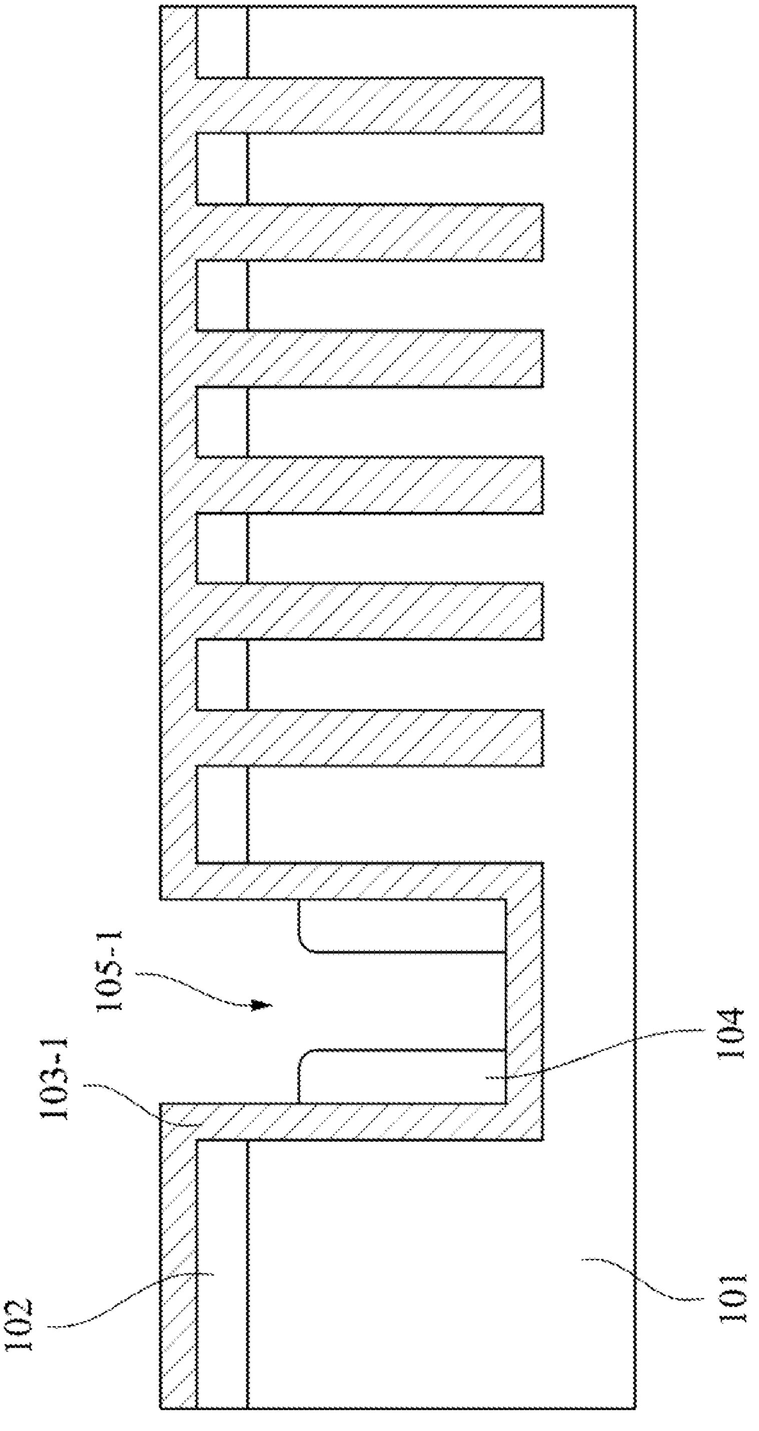
FIG. 3D is a partial cross-sectional view of an intermediate stage of a fabricating method of a memory device according to an embodiment of the disclosure.

Reference is made to FIG. 3D. FIG. 3D shows a partial cross-sectional view of an intermediate stage of method 200 in FIG. 2 according to an embodiment of the present disclosure. As shown in FIG. 3D, after operation 240, the nitride layer 106 is selectively removed to form spacers 104. In an exemplary embodiment, the nitride layer 106 may be etched by any suitable etching process. A difference between the etch selectivity of the first oxide layer 103-1 and the etch selectivity of the nitride layer 106 is chosen to be large. As a result, the first oxide layer 103-1 can act as an etch stop layer. The nitride layer 106 is etched until the top surface of the first oxide layer 103-1 is fully exposed and a portion of the first oxide layer 103-1 at the bottom of the first isolation trench 105-1 is exposed, leaving two portions of the nitride layer 106 along the sidewalls of the first isolation trench 105-1. These two portions of the nitride layer 106 are then referred to as spacers 104. The spacers 104 have slightly oblique, tapered sidewalls due to uneven etching.

The presence of the spacers 104 further relieves the compressive stress caused by the first oxide layer 103-1. To be more specific, since the spacers 104 include silicon nitride, the tensile stress of the spacers 104 provides a bending moment to the first oxide layer 103-1 and thus balances the opposite bending moment induced by the first oxide layer 103-1.

Figure 3E:
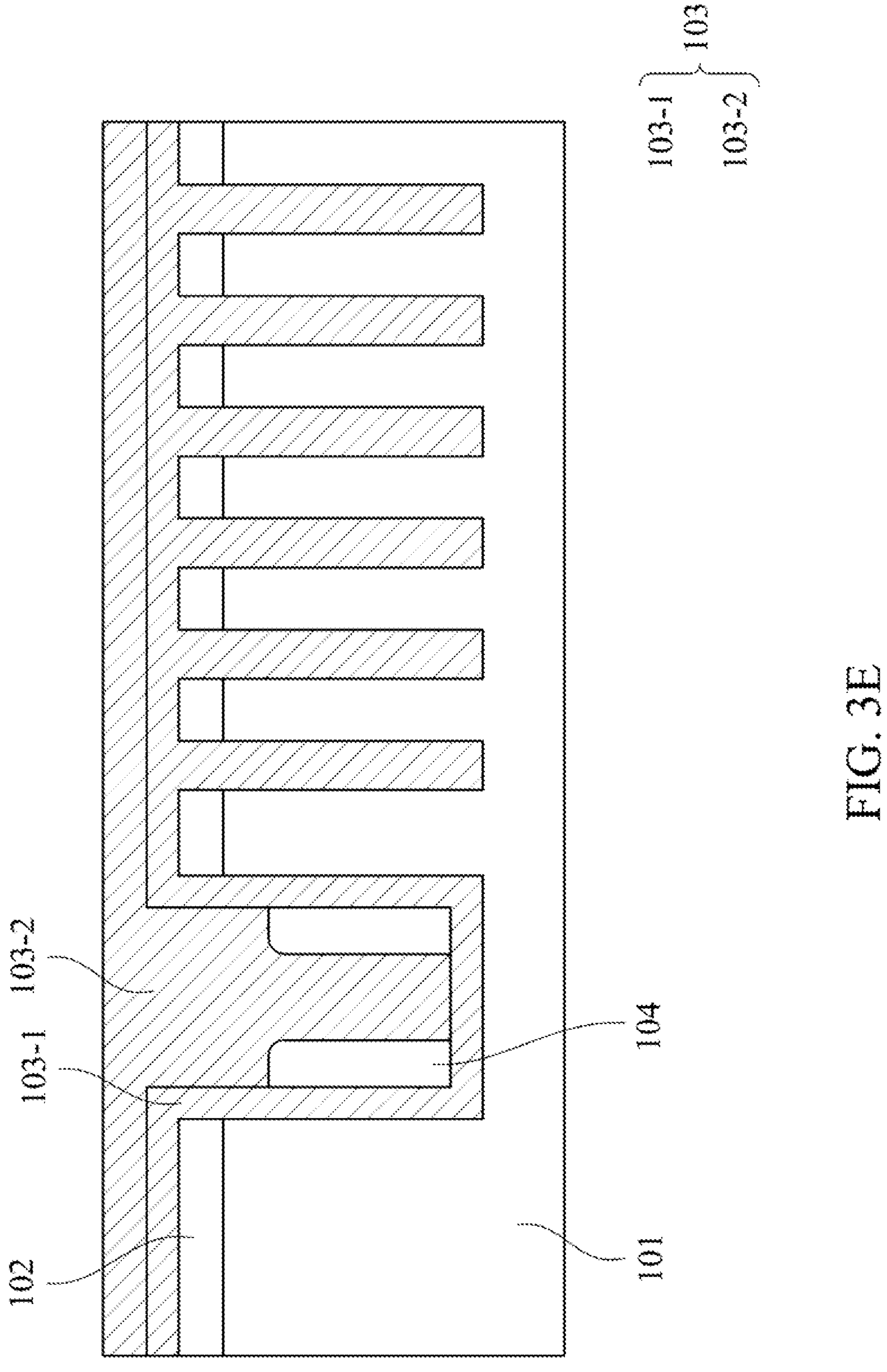
FIG. 3E is a partial cross-sectional view of an intermediate stage of a fabricating method of a memory device according to an embodiment of the disclosure.

Reference is made to FIG. 3E. FIG. 3E shows a partial cross-sectional view of an intermediate stage of method 200 in FIG. 2 according to an embodiment of the present disclosure. As shown in FIG. 3E, after operation 250, the second oxide layer 103-2 is deposited on the first oxide layer 103-1 and the spacers 104. The second oxide layer 103-2 fully fills the first isolation trench 105-1. The deposition of the second oxide layer 103-2 is performed by flowable chemical vapor deposition, such as spin-on dielectric (SOD) deposition. In a SOD deposition process, the flowable material containing oxide is spread on the first oxide layer 103-1 and the spacer 104, and then it fills the first isolation trench 105-1 in a liquid state. Next, the material is heated to transform from a liquid state to a solid state. The SOD deposition process has excellent gap-filling performance and takes less time than the high-density chemical vapor deposition to form an oxide layer with the same thickness.

The second oxide layer 103-2 has a much lower density than the first oxide layer 103-1. Therefore, a densification process is performed following the SOD deposition process. For example, the densification process may involve heating, steaming, and/or annealing in a process chamber.

Typically, the densification process may cause undesirable extra stress concentration to the second oxide layer 103-2, making the second oxide layer have higher compressive stress than the first oxide layer 103-1. Despite this, since the second oxide layer 103-2 is not in contact with the silicon layer 101, the extra stress concentration may not cause much wafer warpage to the structure of the memory device. Further, in some embodiments, the stress concentration in the second oxide layer 103-2 may be easily compensated by the subsequent fabrication processes. Although the densities of the first oxide layer 103-1 and the second oxide layer 103-2 are different, there is no apparent interface between the two. Therefore, the first oxide layer 103-1 and the second oxide layer 103-2 are collectively referred to as the oxide layer 103 and are shown to be one unity in FIG. 1.

Figure 3F:
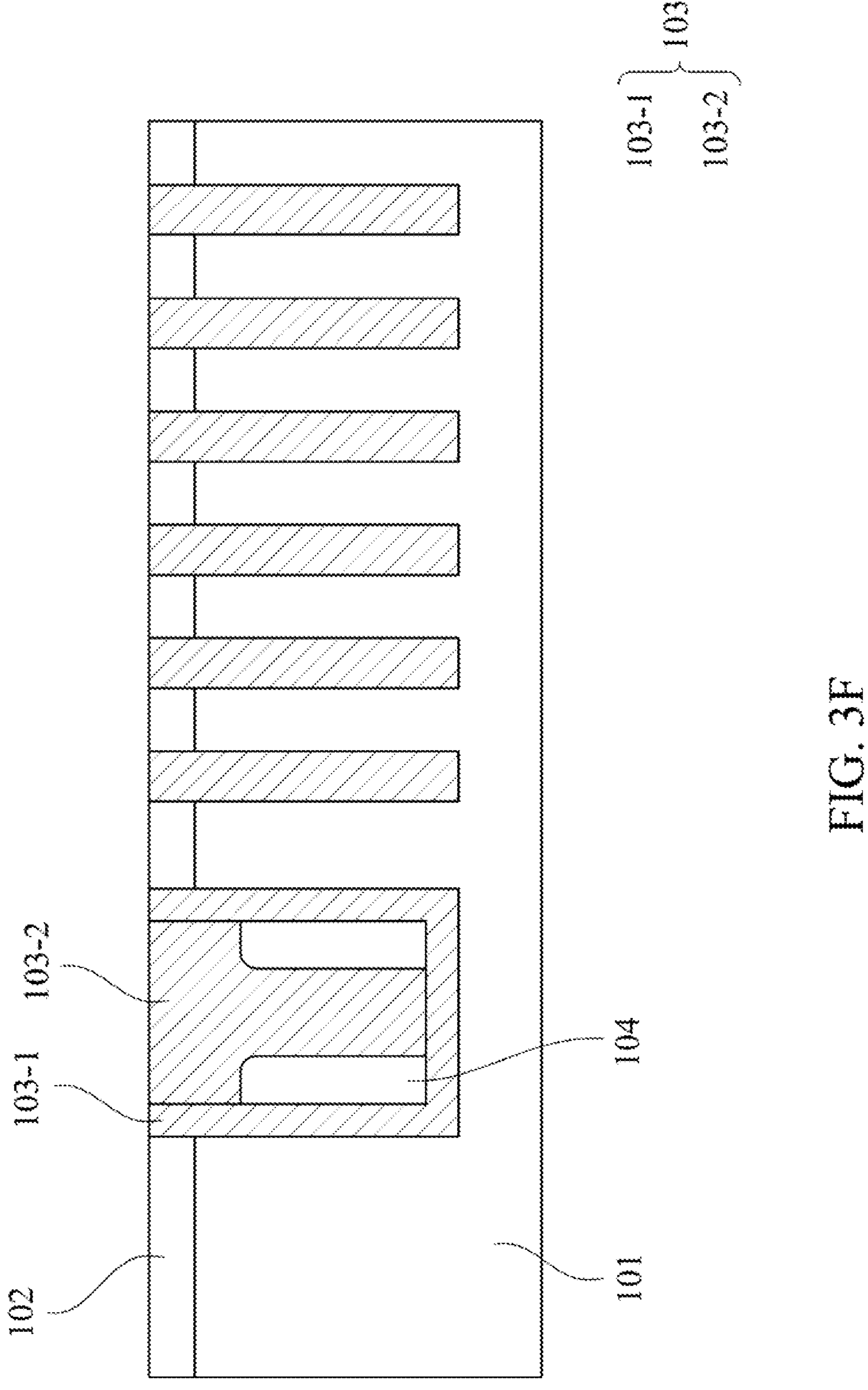
FIG. 3F is a partial cross-sectional view of an intermediate structure of a memory device according to an embodiment of the disclosure.

Reference is made to FIG. 3F. FIG. 3F shows a partial cross-sectional view of an intermediate structure of a memory device according to an embodiment of the present disclosure. Since the thickness of the second oxide layer 103-2 may vary after the densification process, dishing to the surface of the second oxide layer 103-2 may occur. Therefore, the structure formed by method 200 is further processed using a chemical mechanical polishing (CMP) process or other etch-back processes to planarize the top surface of the structure, as shown in FIG. 3F. In an exemplary embodiment, the oxide layer 103 after the CMP process has a thickness of about 100 nm to about 150 nm. For example, the thickness of the oxide layer 103 is about 130 nm.

Figure 4:
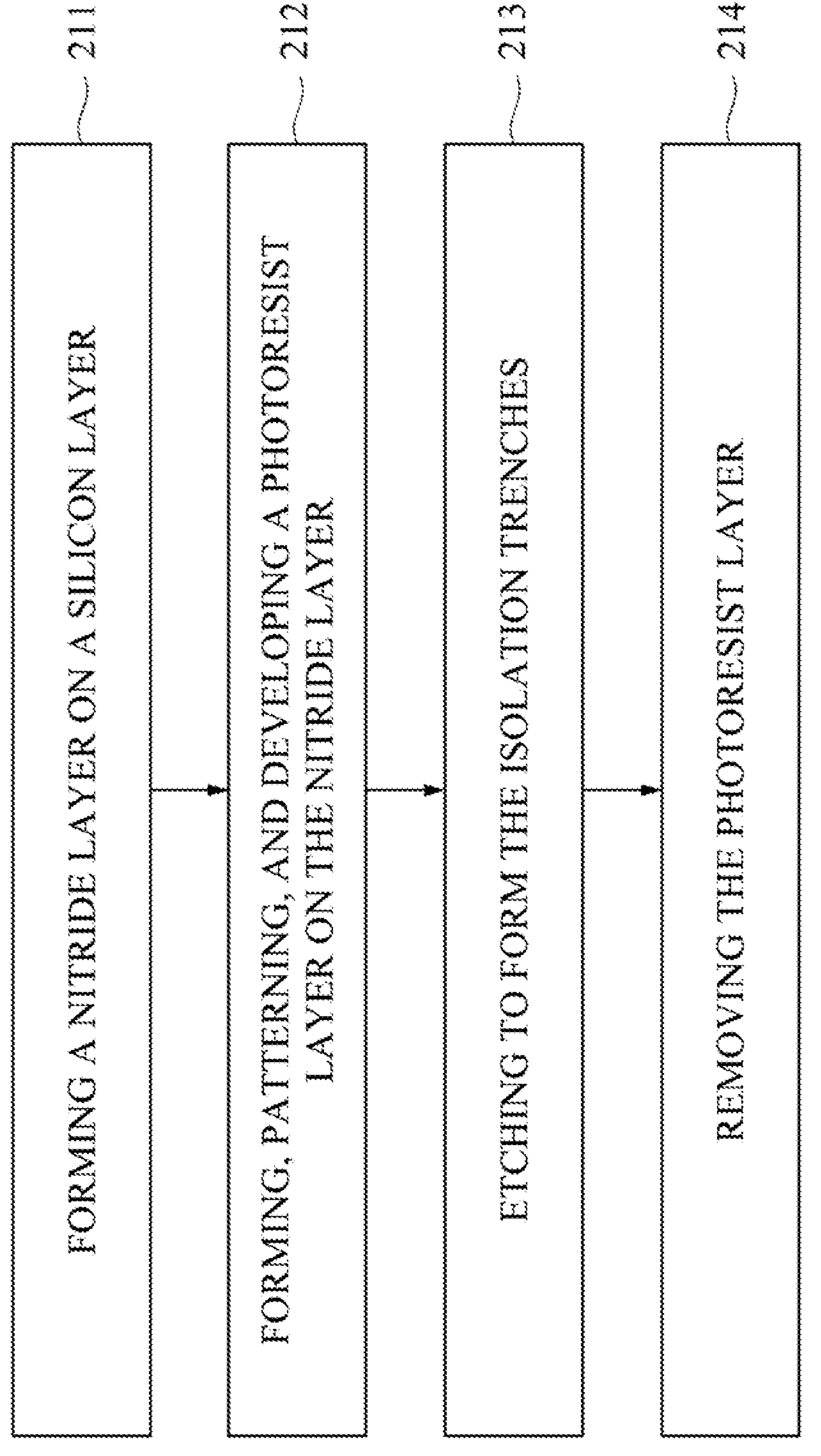
FIG. 4 is a flow chart of an operation of the fabricating method of a memory device in FIG. 2 according to an embodiment of the present disclosure.

Reference is made to FIG. 4 FIG. 4 is a flow chart of operation 210 of method 200 in FIG. 2 according to an embodiment of the present disclosure. As shown in FIG. 4, operation 210 starts with step 211 of forming a nitride layer on a silicon layer. Operation 210 proceeds to step 212 of forming, patterning, and developing a photoresist layer on the nitride layer. Operation 210 further involves step 213 of etching through the nitride layer and a portion of the silicon layer to form the isolation trenches 105. Moreover, in step 214 of operation 210, the remaining photoresist layer is removed in a process chamber 108. Upon completion of operation 210, an intermediate structure of the memory device 100 in FIG. 3A is formed.

Figure 5A:
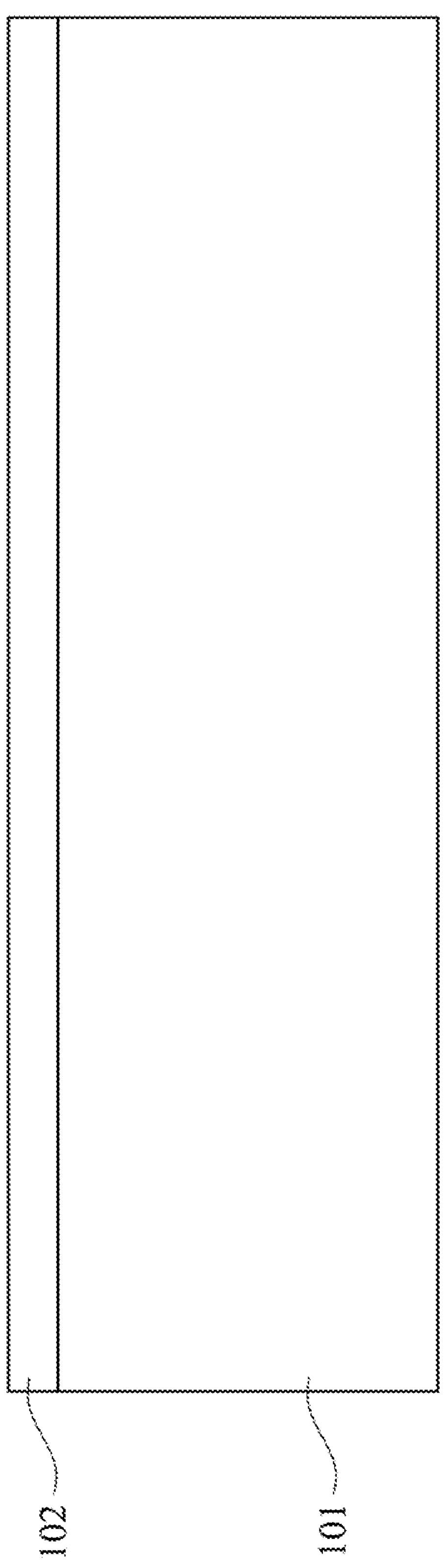
FIG. 5A is a partial cross-sectional view of an intermediate stage of the operation of the fabricating method of a memory device according to an embodiment of the disclosure.

Reference is made to FIG. 5A. FIG. 5A is a partial cross-sectional view of an intermediate stage of operation 210 of method 200 in FIG. 4 according to an embodiment of the present disclosure. As shown in FIG. 5A, a nitride layer 102 is formed on a silicon layer 101. In an exemplary embodiment, the nitride layer 102 is deposited over the silicon layer 101 using any suitable CVD process, such as LPCVD, PECVD, etc.

Figure 5B:
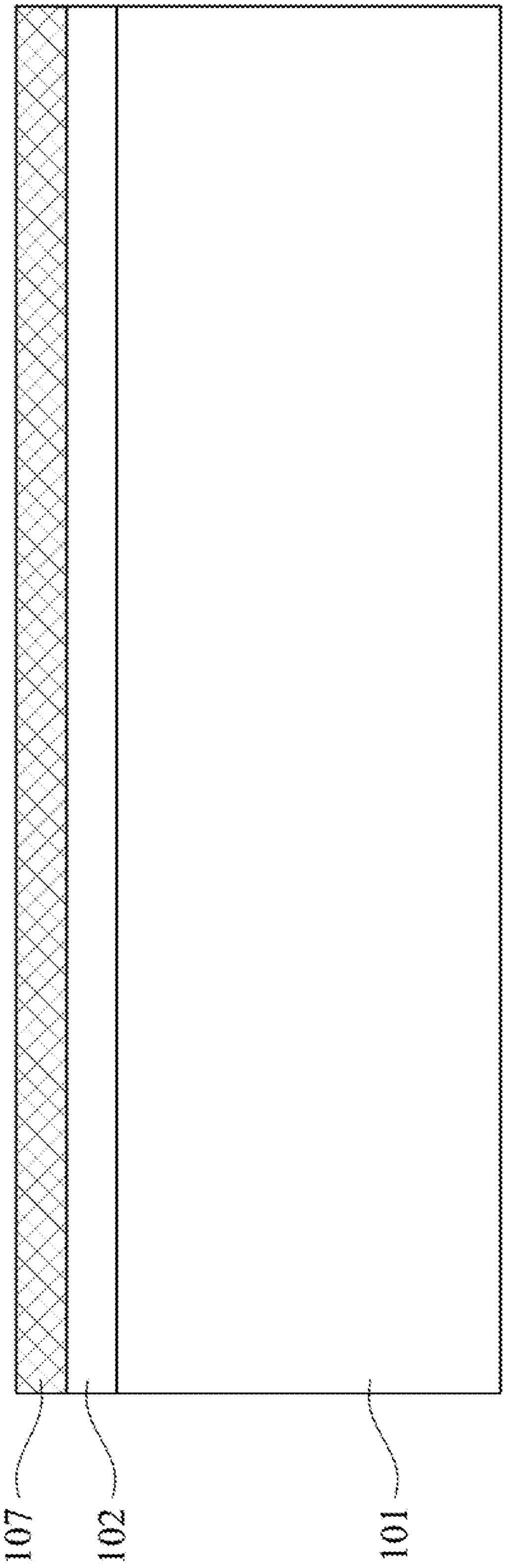
FIG. 5B is a partial cross-sectional view of an intermediate stage of the operation of the fabricating method of a memory device according to an embodiment of the disclosure.

Reference is made to FIG. 5B. FIG. 5B is a partial cross-sectional view of an intermediate stage of operation 210 of method 200 in FIG. 4 according to an embodiment of the present disclosure. As shown in FIG. 5B, a photoresist layer 107 is coated and soft-baked on the nitride layer 102.

Figure 5C:
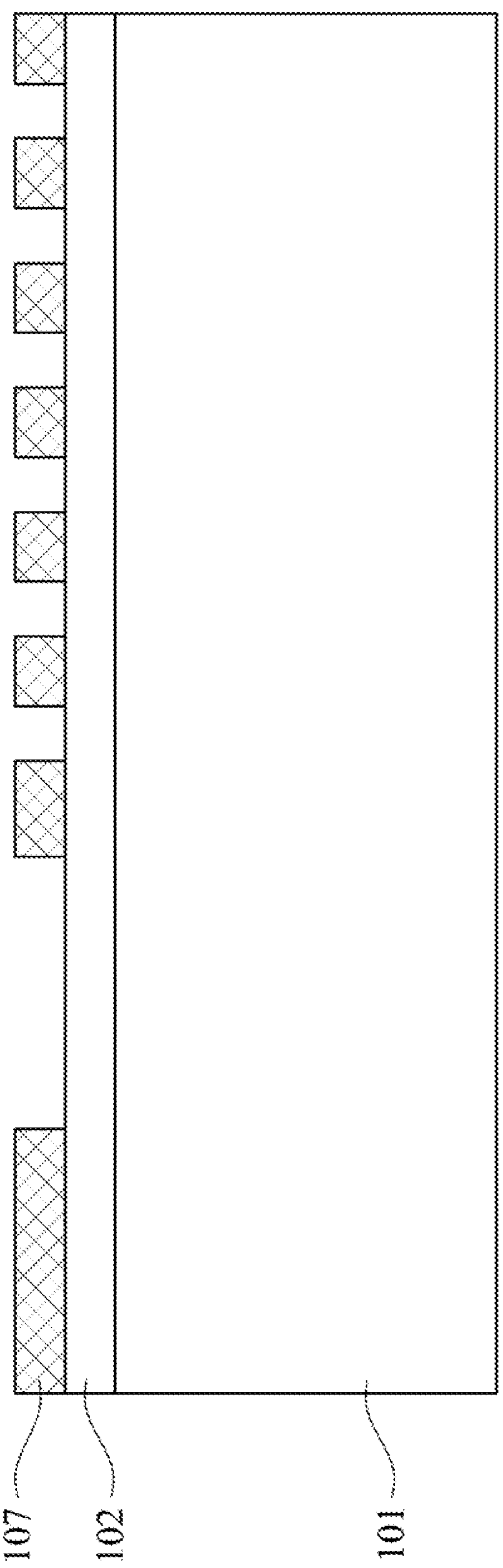
FIG. 5C is a partial cross-sectional view of an intermediate stage of the operation of the fabricating method of a memory device according to an embodiment of the disclosure.

Reference is made to FIG. 5C. FIG. 5C is a partial cross-sectional view of an intermediate stage of operation 210 of method 200 in FIG. 4 according to an embodiment of the present disclosure. In operation 210, the photoresist layer 107 underwent a lithography process in order to form patterns. In some embodiments, a reticle or a fine metal mask that blocks ultraviolet (UV) radiation is placed over the photoresist layer 107. The photoresist layer 107 is then selectively exposed to UV radiation. Depending on whether positive or negative photoresist is employed, either exposed or unexposed portions of the photoresist layer 107 are rinsed by developing solution. As shown in FIG. 5C, the remaining photoresist layer 107 has patterns and can act as an etching mask in the following step.

Figure 5D:
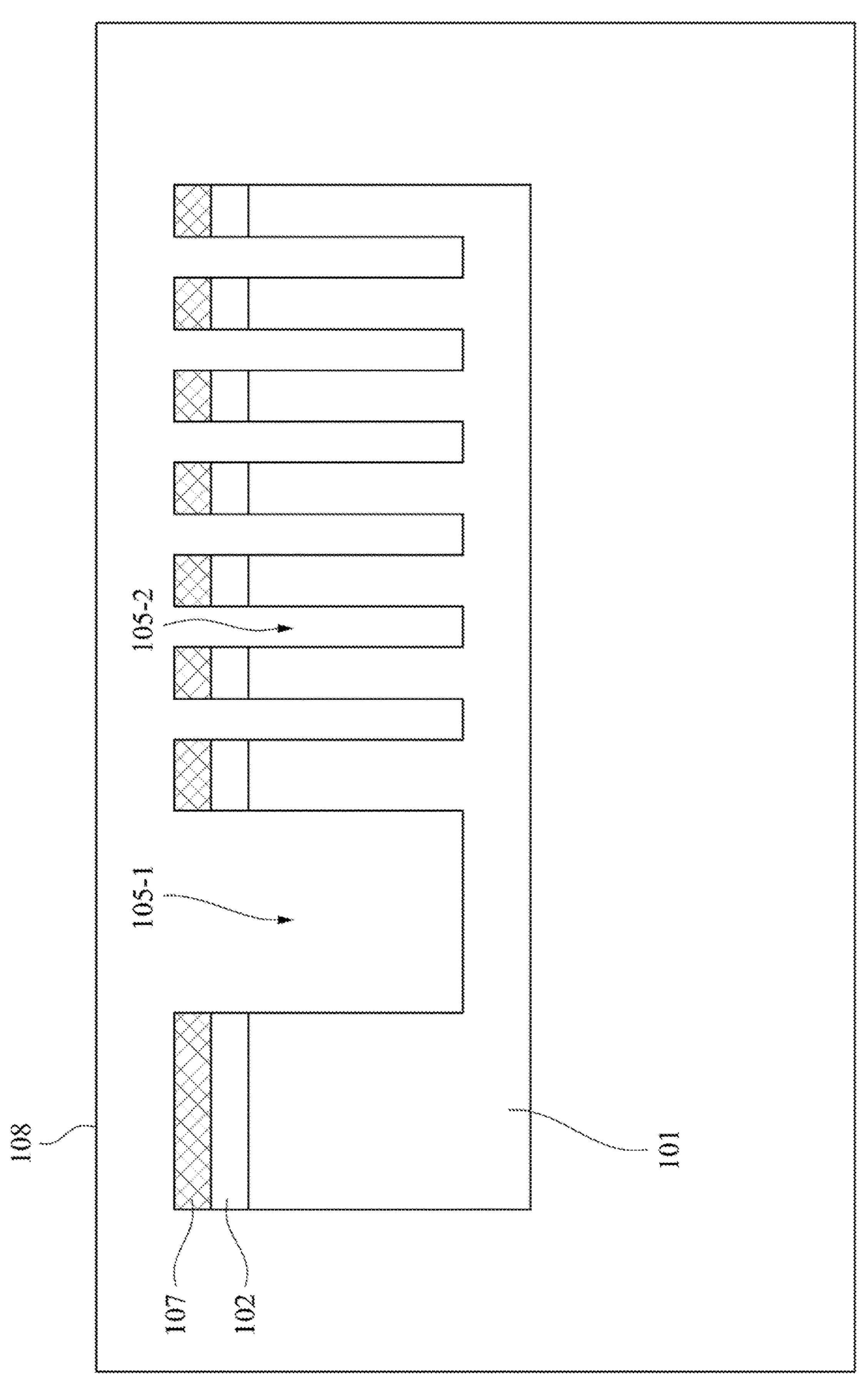
FIG. 5D is a partial cross-sectional view of an intermediate stage of the operation of the fabricating method of a memory device according to an embodiment of the disclosure.

Reference is made to FIG. 5D. FIG. 5D is a partial cross-sectional view of an intermediate stage of operation 210 of method 200 in FIG. 4 according to an embodiment of the present disclosure. As shown in FIG. 5D, utilizing the remaining photoresist layer 107 as an etching mask, the nitride layer 102 and pre-selected portions of the silicon layer 101 are etched into to form the first isolation trench 105-1 and the second isolation trenches 105-2. The first isolation trench 105-1 and the second isolation trenches 105-2 may be etched using an anisotropic etching process, such as reactive ion etching (RIE) process.

The resultant memory device formed in some embodiments of this disclosure may be employed for central processing units (CPU); volatile memory devices such as DRAM devices, static random access memory (SRAM) devices; input/output devices; and non-volatile memory devices such as programmable read-only memory (PROM) devices.

According to the foregoing recitations of the embodiments of the disclosure, it may be seen that in the memory device and the fabricating method of the present disclosure, by disposing spacers in the shallow trench isolations around the peripheral circuit area, stress concentration on the interfaces between layers may be reduced. To be more specific, less stress concentration may prevent warpage and pattern scattering, and thus reduce misalignment and consequent bit line overlay shift. Hence, a highly miniaturized memory device with less bit line-to-bit line current leakage issues may be accomplished.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A fabricating method of a memory device, comprising:

forming a plurality of isolation trenches in a substrate, wherein the substrate comprises a silicon layer and a first nitride layer;

forming a first oxide layer carpet-covering the first nitride layer and the plurality of isolation trenches;

forming a second nitride layer carpet-covering the first oxide layer;

removing portions of the second nitride layer so that at least a portion of the first oxide layer is exposed and remaining portions of the second nitride layer form a plurality of spacers with their top surfaces lower than a surface of the substrate;

forming a second oxide layer to cover the plurality of spacers to an extent that the surface of the second oxide layer is higher than the surface of the substrate; and removing portions of the second oxide layer such that the second oxide layer and the substrate are coplanar.

2. The fabricating method of a memory device of claim 1, wherein the removing the portions of the second oxide layer is performed by chemical mechanical polishing.

3. The fabricating method of a memory device of claim 1, wherein the forming the plurality of isolation trenches comprises:

forming the first nitride layer overlying the silicon layer;

forming a photoresist layer overlying the first nitride layer;

performing a lithography process to remove portions of the photoresist layer;

etching through the first nitride layer and a portion of the silicon layer utilizing remaining portions of the photoresist layer as an etching mask to form the plurality of isolation trenches; and removing the remaining portions of the photoresist layer.

4. The fabricating method of a memory device of claim 3, wherein the etching through the first nitride layer and the portion of the silicon layer is performed by reactive ion etching.

5. The fabricating method of a memory device of claim 1, wherein the plurality of isolation trenches are formed such that the plurality of isolation trenches form a first patterned zone and a second patterned zone upon completion of etching, the first patterned zone comprises a plurality of first trenches having first trench widths, the second patterned zone comprises a plurality of second trenches having second trench widths, and the first trench widths are larger than the second trench widths.

6. The fabricating method of a memory device of claim 1, wherein the forming the second oxide layer comprises:

depositing the second oxide layer by spin on dielectric deposition process; and densifying the second oxide layer.

7. The fabricating method of a memory device of claim 1, wherein the first nitride layer and the second nitride layer comprise silicon nitride, and the first oxide layer and the second oxide layer comprise silicon oxide.

8. The fabricating method of a memory device of claim 7, wherein the removing the portions of the second nitride layer is performed by an etching process that has a high selectivity between silicon nitride and silicon oxide so that the first oxide layer remains substantially identical when the portions of the second nitride layer are etched away.

9. The fabricating method of a memory device of claim 1, wherein the forming the second nitride layer is performed by chemical vapor deposition.

* * * * *